United States Patent [19]
Hata et al.

[11] Patent Number: 5,332,451
[45] Date of Patent: Jul. 26, 1994

[54] EPITAXIALLY GROWN COMPOUND-SEMICONDUCTOR CRYSTAL

[75] Inventors: Masahiko Hata, Urbana, Ill.; Noboru Fukuhara, Ibaraki; Takayoshi Maeda, Mie, both of Japan

[73] Assignee: Sumitomo Chemical Company, Limited, Osaka, Japan

[21] Appl. No.: 875,410

[22] Filed: Apr. 29, 1992

[30] Foreign Application Priority Data

Apr. 30, 1991 [JP] Japan .................. 3-099006

[51] Int. Cl.⁵ .......................................... H01L 29/36
[52] U.S. Cl. ................................. 148/33.2; 148/33.1; 148/33.3; 437/81; 437/82; 437/126; 437/131
[58] Field of Search ............... 148/33.2, 33.1, 33.3, 148/33.4, 33.5, 33.6; 437/81, 126, 133, 82, 131

[56] References Cited
U.S. PATENT DOCUMENTS

| | | |
|---|---|---|
| 4,157,556 | 6/1987 | Decker et al. |
| 4,688,062 | 8/1987 | Liles |
| 4,804,639 | 2/1989 | Yablonovitch ............ 148/33.1 |
| 4,833,101 | 3/1989 | Fujii ................... 437/126 |
| 4,891,329 | 1/1990 | Reisman et al. ........ 148/33.3 |
| 4,907,974 | 3/1990 | Gotoh ................. 437/129 |
| 4,927,782 | 5/1990 | Davey et al. ........... 437/126 |
| 4,952,527 | 8/1990 | Calawa et al. ........... 437/82 |
| 4,965,224 | 10/1990 | Horikawa et al. ........ 437/81 |
| 5,010,381 | 4/1991 | Shiba .................. 437/126 |
| 5,024,967 | 6/1991 | Kopf et al. ............. 437/81 |

FOREIGN PATENT DOCUMENTS

| | | |
|---|---|---|
| 0415660 | 3/1991 | European Pat. Off. |
| 101976 | 6/1985 | Japan |
| 1-261818 | 10/1989 | Japan |
| 3-022519 | 1/1991 | Japan |

Primary Examiner—Tom Thomas
Assistant Examiner—Kevin M. Picardat
Attorney, Agent, or Firm—Sughrue, Mion, Zinn, Macpeak & Seas

[57] ABSTRACT

An epitaxially grown compound-semiconductor crystal comprising a substrate, a buffer layer formed directly or indirectly on the substrate, and an active layer formed on the buffer layer. The buffer layer comprises (A) a high-resistivity AlGaAs or AlGaInP layer doped with oxygen or/and a transition metal and, formed thereon, (B) a layer consisting of high-purity GaAs, InGaP, or AlGaAs.

17 Claims, 4 Drawing Sheets

EPITAXIALLY GROWN COMPOUND-SEMICONDUCTOR CRYSTAL

FIELD OF THE INVENTION

The present invention relates to an epitaxially grown compound-semiconductor crystal suitable for use in the fabrication of a field-effect transistor (hereinafter referred to as "FET") and a semiconductor integrated circuit (hereinafter referred to as "IC") employing an FET as a basic element.

BACKGROUND OF THE INVENTION

Epitaxially grown compound-semiconductor crystals (hereinafter often referred to simply as "epitaxial crystals") of GaAs, AlGaAs, InGaAs, InAlAs, GaInP, AlGaInP and the like are extremely useful as materials for superhigh-speed FET elements, the demand for which is growing rapidly in recent years in applications such as various amplifiers for use in the superhigh frequency region and high-speed ICs.

An FET element for use in such applications is usually fabricated by processing crystal layers which are formed by epitaxy on a semi-insulating single-crystal substrate to have a predetermined carrier concentration, thickness, and composition. The epitaxial crystals as materials for such FET elements are produced by the vapor-phase epitaxial growth method, the molecular-beam epitaxy method, and the liquid-phase epitaxial growth method. For example, an epitaxial crystal for a high electron mobility transistor (hereinafter referred to as "HEMT") which is attracting attention as a kind of superhigh-speed FETs in recent years, is produced by a metal organic chemical vapor deposition method which is one of vapor-phase epitaxial growth methods. That is, arsine, trimethylgallium, and trimethylaluminum, as raw materials, and a dopant gas are fed successively over a heated single-crystal GaAs substrate and pyrolyzed, whereby an undoped GaAs layer (about 0.5 μm thick), undoped $Al_{0.3}Ga_{0.7}As$ layer (about 0.001 to 0.02 μm thick), n-type $Al_{0.3}Ga_{0.7}As$ layer (about 0.035 to 0.05 μm thick), and n-type GaAs crystal layer (0.05 to 0.15 μm thick) are successively groton epitaxially and, thus, an epitaxial crystal having the desired structure can be obtained.

However, conventional epitaxial crystals have had a problem that FET elements fabricated therefrom do not always have good characteristics. Conventional epitaxial crystals for FET generally have a high-purity buffer layer with a thickness of about 0.2 to 5 μm between the substrate and the active layer in order to exclude the adverse influence of a defective layer apt to form at the interface between the substrate and the epitaxially growing crystal. The buffer layer is required to be a high-resistivity crystal layer in order to diminish current leakage through the buffer layer itself. However, while high-resistivity buffer layers may be stably obtained if buffer layer crystals having a high purity can be formed, this have posed some problems. That is, it is considerably difficult to reduce the amount of residual impurities included in epitaxial crystals, and if the purity of an epitaxial crystal becomes higher, the influence of impurities and defects present in the substrate and at the interface between the epitaxial layer and the substrate becomes relatively more serious. Therefore, in order to obtain a crystal having the required high resistivity, not only the epitaxial layer but also the substrate itself, the substrate-cleaning process, and the atmosphere in the epitaxial growth furnace should be strictly regulated, and practicing this has involved considerable difficulties.

If a buffer layer or a part thereof has a low resistivity, current leakage through the buffer layer is apt to occur. This is considered to be one cause of poor FET characteristics and has been an obstacle to the application of buffer layer crystals to FETs. In the case of crystals for use in ICs, they also have had the problem of nonuniformity in threshold voltage which is also attributable to buffer layer impurities.

In order to avoid the above problems, an attempt has been made to reduce the residual carrier concentration by means of the impurity compensation by incorporating, into a buffer layer crystal upon growing, a dopant, such as chromium, oxygen, vanadium, or the like, which forms a deep level in the forbidden band of the crystal. Particularly, it has been reported that in the case of forming a crystal containing Al as a crystal component, a crystal layer having a high resistivity can be obtained by doping with oxygen or a transition metal, utilizing the extremely high activity of Al (as disclosed in JP-A-3-22519 and JP-A-1-261818). (The term "JP-A" as used herein means an "unexamined published Japanese patent application".) It is known that oxygen and transition metals form deep levels in the forbidden band of a semiconductor. It is therefore possible to effectively compensate the adverse influence of impurities from the substrate and from the epitaxial growth furnace atmosphere on the epitaxial crystal and epitaxial layer by incorporating a large number of deep levels into the Al-containing crystal by utilizing the high activity of Al against oxygen transition metals. Thus, high-resistivity crystals can be produced stably.

However, use of an Al-containing high-resistivity epitaxial layer doped with oxygen or a transition metal as a buffer layer in the fabrication of FETs has been found to have the following problems. That is, when an active layer is formed on the high-resistivity crystal to fabricate an FET and its static characteristics are examined, it shows a hysteresis in its drain current-drain voltage characteristics and also shows a kink phenomenon in which the drain current abnormally increases during application of a constant drain voltage. Further, in the case of fabricating an HEMT having a selectively doped structure, decrease in two-dimensional electron gas density results. Although the cause of these phenomena has not been elucidated, a large number of the deep levels incorporated into the high-resistivity buffer layer are presumed to have brought about these abnormal characteristics. For this reason, an Al-containing high-resistivity epitaxial layer doped with oxygen or a transition metal cannot be always regarded as high-quality with respect to FET characteristics even when the epitaxial layer has a satisfactorily high resistivity. It has, hence, been found that when such conventional buffer layers doped with oxygen or a transition metal are used in the fabrication of various FETs, high resistivity for buffer layers and good FET characteristics can hardly be attained simultaneously. Therefore, there has been a desire for a crystalline material that stably has a high resistivity and exerts little influence on the characteristics of FET elements to be fabricated therefrom.

SUMMARY OF THE INVENTION

Accordingly, an object of the present invention is to provide an epitaxial crystal that has a high resistivity even with a practically attainable crystal purity level, enables high-speed electronic elements fabricated therefrom to have good characteristics, and has a structure that can be stably produced industrially.

Other objects and effects of the present invention will be apparent from the following description.

The present invention relates to an epitaxially grown compound-semiconductor crystal comprising a substrate, a buffer layer formed directly or indirectly on the substrate, and an active layer formed on the buffer layer, the buffer layer comprising (A) a high-resistivity AlGaAs or AlGaInP layer doped with oxygen or/and a transition metal and, formed thereon, (B) a layer consisting of high-purity GaAs, InGaP, or AlGaAs.

According to the present invention, a sufficiently high resistivity can be attained even with a practically attainable crystal purity level, and the influence of the doped impurity oxygen or transition metal, which is necessary for high resistivity, on electronic element characteristics can be diminished or reduced to a practically negligible level. By adopting such a structure, it becomes possible to stably produce various crystals for FET in which high buffer layer resistivity and good FET characteristics are simultaneously attained.

DETAILED DESCRIPTION OF THE INVENTION

For producing the epitaxial crystal of the present invention, any epitaxial growth method which can grow a mixed crystal containing Al may be applied. Examples of the epitaxial method include the liquid-phase epitaxial growth method, the metal organic chemical vapor deposition method, the molecular-beam epitaxy method, the chemical-beam epitaxy method, the atomic layer epitaxy method and the like.

Examples of the material for the substrate include GaAs and InP. These materials are generality used in the form of wafer cut out from a single crystal obtained, for example, by the LEC process.

The present invention is explained in detail with respect to a crystal for FET prepared by the metal organic chemical vapor deposition method and consisting of an AlGaAs buffer layer and an n-type GaAs active layer, as one embodiment of the present invention.

As sources of Group III element used in crystal growth, trialkylgalliums such as trimethylgallium and triethylgallium; trialkylaluminums such as trimethylaluminum and triethylaluminum; aluminum trihydride-trimethyl amine adduct; trialkylindiums such as trimethylindium and triethylindium; cyclopentadienylindium and the like may be employed. These may be used alone or as a mixture of two or more thereof according to the composition of the desired compound semiconductor. As these raw materials, commercially available materials may be used as they are since they have such a high purity that crystals to be obtained therefrom have a satisfactorily high purity. As sources of Group V element, commercially available arsine and phosphine may be employed. Besides these, alkylarsines such as trimethyl arsine, triethyl arsine and mono-tert-buthyl arsine; and alkylphosphines such as trimethyl phosphine, triethyl phosphine and mono-tert-buthyl phosphine may also be employed. Adducts of Group III element raw compounds with appropriate organic Group V element compounds such as trimethyl indium-trimethyl phosphine adduct may also be usable.

Figure 1:
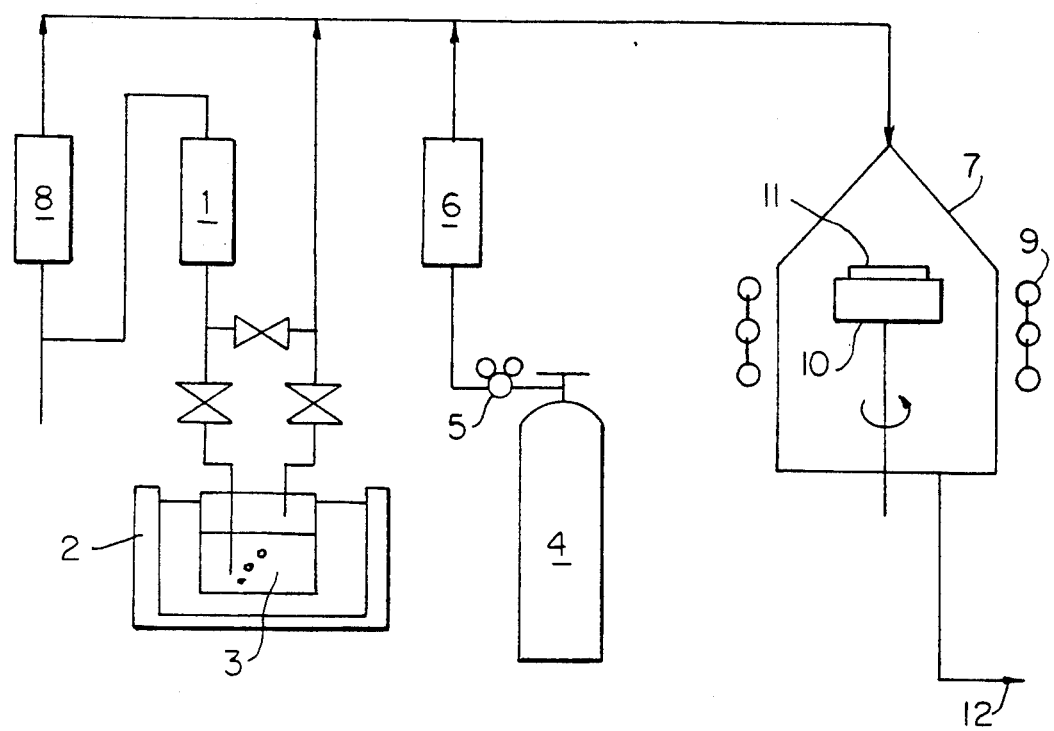
FIG. 1 is a schematic view illustrating one embodiment of a vapor-phase epitaxial growth apparatus which can be used for producing a compound-semiconductor crystal according to the present invention.

FIG. 1 is a schematic view illustrating an epitaxial growth apparatus for producing a GaAs epitaxial crystal by metal organic chemical vapor deposition, which can be employed in the compound-semiconductor crystal of the present invention. With reference to this figure, the present invention will be explained below in detail.

A carrier gas, the flow rate of which is controlled by mass flow controller 1, is sent to bubbler 3 whose temperature is regulated by constant-temperature bath 2. The carrier gas is bubbled into a trialkylgallium placed in bubbler 3 and is then introduced into reactor 7 along with a trialkylgallium vapor formed by evaporation by the bubbling. The amount of the thus-introduced trialkylgallium vapor is controlled by regulating both the vapor pressure determined by the temperature of the liquid trialkylgallium and the flow rate of the carrier gas being bubbled. The trialkylgallium vapor is generally introduced in an amount of from $10^{-3}$ to $10^{-5}$ mol/min. Arsine, which usually is stored in high-pressure vessel 4 made of aluminum or steel, is introduced into reactor 7, while the flow rate of arsine is regulated by mass flow controller 6 after the arsine pressure is regulated with pressure-reducing valve 5. In general, arsine is introduced in an amount in the range of from 5 to 200 times by mol the amount of the gallium source. Arsine and trialkylgallium vapor are generally sent to reactor 7 by means of mass flow controller 8 along with the carrier gas whose flow rate is regulated. In reactor 7, graphite supporting table (susceptor) 10 has been disposed which can be heated by radio-frequency induction by means of external coils 9. The mixed gas consisting of the above-described raw materials and carrier gas is pyrolyzed around substrate 11 placed on susceptor 10, and an epitaxial crystal of GaAs grows on substrate 11. The gas that has undergone reaction is discharged through gas outlet 12.

While the above is an explanation of GaAs epitaxial growth as an example, it is possible to obtain an AlGaAs epitaxial crystal by feeding a trialkylaluminum along with the trialkylgallium using the same gas feeder as that used above for the trialkylgallium. Likewise, an InGaAs and InAlAs epitaxial crystal can be obtained by further feeding a trialkylindium. Epitaxial crystals of InGaP, InAlP, and InGaAlP can also be obtained by using P in place of As. As sources of As and P, hydrides thereof such as those mentioned hereinabove and organic compounds of As or P may be used. In the case of using organic compounds of As or P, the same feeding method as that for the above trialkylgallium may be used.

The high-quality epitaxial crystal of the present invention for use in high-speed electronic elements can be stably obtained by first growing on a cleaned substrate a high-resistivity AlGaAs, AlInGaP, or InAlAs layer doped with oxygen or/and a transition metal at a predetermined thickness, subsequently growing a high-purity GaAs, AlGaAs, or InGaP layer at a predetermined thickness, and then growing an active layer crystal having a predetermined carrier concentration, composition, and thickness by switching the raw materials and incorporating impurities, which are conducted in a predetermined manner. By appropriately selecting the structure of the active layer, the produced compound-semiconductor crystal can be used to fabricate ordinary FETs, as well as various kinds of hetero-junction FETs such as HEMTs and metal insulator semiconductor (MIS) FETs. Since the compound-semiconductor crystal of the present invention is formed to have the above-described specific construction, the layer formed at the initial stage of crystal growth, purity control of which is very difficult, can be stably regulated to have a high resistivity. At the same time, the influence of impurity oxygen on the active layer can be substantially diminished.

In the present invention, a high-purity GaAs or InP layer of 10Å to 1μ in thickness may be formed on a substrate before the AlGaAs, AlInGaP, or InAlAs layer doped with oxygen or/and a transition metal is grown on the substrate. This embodiment is useful especially when the surface roughness of the substrate may cause a problem.

In the case where the high-resistivity layer doped with oxygen or/and a transition metal is an oxygen-doped high-resistivity layer having a composition of the formula $Al_xGa_{(1-x)}As$, x is larger than 0 in order to attain sufficient activity against oxygen. However, if x is too small, a sufficiently high resistivity is difficult to obtain because of the limited amount of incorporated oxygen, while if x is too large, the crystal is unstable and susceptible to oxidation. Hence, it is preferred that $0.1 < x < 0.8$, with $0.2 \leq x \leq 0.7$ being more preferred. In the case where the high-resistivity layer has a composition of the formula $Al_xIn_yGa_{(1-x-y)}P$, y is generally about 0.49, preferably 0.49±0.05, more preferably 0.49±0.01 from the standpoint of lattice matching in the case of using a GaAs substrate. The proportion of Al may generally be in a range of $0 < x \leq$ (about 0.51). In the case where the high-resistivity layer is doped with a transition metal, there is no particular limitation in composition such as those described above, although the composition depends on the kind of the dopant.

In the case of using an InP substrate, $In_{0.51}Al_{0.49}As$ may be used because this system fits the substrate with respect to lattice matching.

The concentration of the dopant, i.e., oxygen or/and a transition metal, varies depending on the purity of the base crystal, but it is preferably about $1 \times 10^{16}$ atoms/cm$^3$ or more in total, and more preferably about $1 \times 10^{17}$ atoms/cm$^3$ or more in total. The upper limit of the dopant concentration cannot be fixed unconditionally, because it varies if growth conditions and other factors are changed. However, since too high dopant concentrations may cause the grown crystal to have a rough surface, the dopant concentration is preferably about $1 \times 10^{21}$ atoms/cm$^3$ or less and more preferably about $1 \times 10^{20}$ atoms/cm$^3$ or less.

As a source of oxygen dopant, oxygen gas diluted with hydrogen or an inert gas can be used. Further, an alkyl aluminum alkoxide formed by partial oxidation of an alkylaluminum as a raw-material organometallic compound may be used. Besides an aluminum source, an aluminum alkoxide may be added as a dopant source. Furthermore, transition metal alkoxides such as triethoxyvanadyl and transition metal compounds such as hexacarbonylchromium, which are known as dopants that impart high-resistivity to Al-containing mixed crystals, can be used. However, it is desirable that the influence of the employed dopant on a high-purity layer to be formed on the high-resistivity layer be as little as possible, that is, it is desirable to employ an impurity which has little residual effect and is less apt to undergo surface segregation.

The high-resistivity layer described above also serves as a gettering layer for preventing the inclusion of impurities from the substrate and its surface and of transient impurities, such as initial contaminants, from the atmosphere in the epitaxial growth furnace. The thickness of this high-resistivity layer is preferably 2,000 Å or more, more preferably 5,000 Å or more, in order that the crystal layer to be grown thereon have a heightened purity. There is no particular upper limit to the thickness of the high-resistivity layer but thicknesses of 5 μm or less are usually preferred from an industrial standpoint.

The high-purity layer formed on the high-resistivity layer may consist of undoped GaAs, AlGaAs, or InGaP. In the case where the high-purity layer has a composition of the formula $In_xGa_{1-x}As$, x is generally 0.49±0.05. This high-purity layer is required to have such a purity that the total concentration of donor impurities, acceptor impurities, and active defects such as electron-trapping deep levels is $1 \times 10^{16}$ per cm$^3$ or less, desirably $1 \times 10^{15}$ per cm$^3$ or less. Even where the concentration of residual impurities is not more than these values, higher crystal resistivities are desirable which are due to mutual compensation by the impurities. In the case where the high-purity layer is made of $Al_xGa_{(1-x)}As$, x may be any number within the range of 0 to 1. However, since too large an Al proportion is apt to result in impaired crystallizability, $x \leq 0.3$ is preferred. Further, in the case of $In_xG_{1-x}P$, x is preferably 0.49±0.05.

The preferred thickness range for the high-purity layer depends on the purity of this crystal layer and the required FET element characteristics level. However, the thickness of the high-purity layer is generally at least 1,000 Å, preferably 3,000 Å or more in order to reduce the influence of the high-resistivity layer to a negligible level, and more preferably 5,000 Å or more. Due to this high-purity crystal layer, an FET element fabricated from the epitaxial crystal can be actually operated while the influence of space charge density fluctuations in the oxygen-doped or transition metal-doped layer, which accompany carrier trapping by deep levels and carrier release therefrom during operation of the FET element, on the current density in the active layer is being diminished or eliminated. On the other hand, too large thicknesses of the high-purity layer may cause a problem concerning current leakage through the high-purity layer according to the resistivity of the layer. Hence, the thickness of the high-purity layer is preferably 20,000 Å or less, and more preferably 10,000 Å or less.

As described above, according to the present invention, an epitaxial crystal for use in high-speed electronic elements can be provided which has good characteristics with little hysteresis and kink phenomenon and is useful as a material for amplifiers for the superhigh frequency region and FETs for logic elements. Further, an epitaxial crystal, in which the influence of the substrate employed and its pretreatment is diminished to stably produce various FETs, can be provided.

The epitaxial crystal of the present invention has a further advantage that in the case where two or more electronic elements are fabricated on the same substrate, interference between the elements can be reduced. Therefore, the epitaxial crystal of the present invention is also useful in fabricating ICs employing an FET as a basic element and, hence, is of considerable industrial significance.

The present invention will be illustrated in more detail with reference to the following Examples and Comparative Examples, but the invention is not construed as being limited to these Examples.

EXAMPLE 1

An epitaxial growth apparatus having the same construction as that shown in FIG. 1 was used except that it further had two feeding means similar to the arsine feeder and capable of feeding disilane diluted with hydrogen to 20 ppm by mole and also had two feeding means similar to the trimethylgallium feeder and capable of feeding trimethylaluminum (these means being not shown in the figure). Using this apparatus and using a semi-insulating GaAs single crystal as a substrate, crystal growth was conducted at a substrate temperature of 650° C., a trimethylgallium (hereinafter referred to as TMG) feed rate of $5.2 \times 10^{-5}$ mol/min, a carrier hydrogen gas flow rate of 9 l/min, and an arsine feed rate of $2.6 \times 10^{-4}$ mol/min (corresponding to As/Ga=50 by mol). A GaAs crystal grew at a rate of 400 Å/min. After the undoped GaAs layer was grown to a thickness of 3,000 Å, commercially available trimethylaluminum (hereinafter referred to as TMA) was fed at a rate of $1.3 \times 10^{-5}$ mol/min along with hydrogen carrier and an oxygen-containing TMA gas obtained by oxidizing commercially available TMA with air and having an impurity oxygen concentration of about 4,000 ppm was fed at a rate of $3.0 \times 10^{-5}$ mol/min along with hydrogen carrier. A crystal layer having a composition of $Al_xGa_{(1-x)}As$ where x indicating Al proportion was 0.5 grew at a growth rate of 800 Å/min. After this layer was grown for 12 minutes and 30 seconds to a thickness of 10,000 Å, feeding of the TMA gas having an impurity oxygen concentration of 4,000 ppm was ceased and a crystal layer having a composition of $Al_xGa_{(1-x)}As$ where x indicating Al proportion was 0.2 was grown for 10 minutes at a growth rate of 500 Å/min. This crystal layer was a p-type layer having a residual carrier concentration of about from $1 \times 10^{15}$ to $3 \times 10^{15}/cm^3$, which was found by a separately conducted experiment. Subsequently, the feeding of TMA was ceased and, at the same time, disilane was introduced at a rate of $8.9 \times 10^{-8}$ mol/min, whereby an n-type GaAs layer was continuously grown at a growth rate of 400 Å/min to a thickness of 0.5 μm. Thereafter, crystal growth was stopped by ceasing the feeding of both TMG and disilane. The resulting crystal was then cooled to 550° C. and arsine feeding was ceased. The crystal in the furnace was then cooled to around room temperature and taken out of the furnace. Thus, crystal samples were obtained.

A part of the samples thus obtained was subjected to Hall effect measurement. As a result, the samples were found to have an electron mobility of 3,900 cm$^2$/V·sec and a sheet carrier concentration of $5 \times 10^{12}/cm^2$ at room temperature.

The samples after the Hall effect measurement were then subjected to etching in which the whole surface of each sample exclusive of electrode parts thereof was etched at a depth of about 0.6 μm, thereby removing the n-type doped GaAs layer in the part other than the electrode parts. The resistivity of the thus-exposed undoped AlGaAs layer was measured and found to be more than $1 \times 10^5$ Ω·cm, showing that the AlGaAs layer had a high resistivity.

Figure 2:
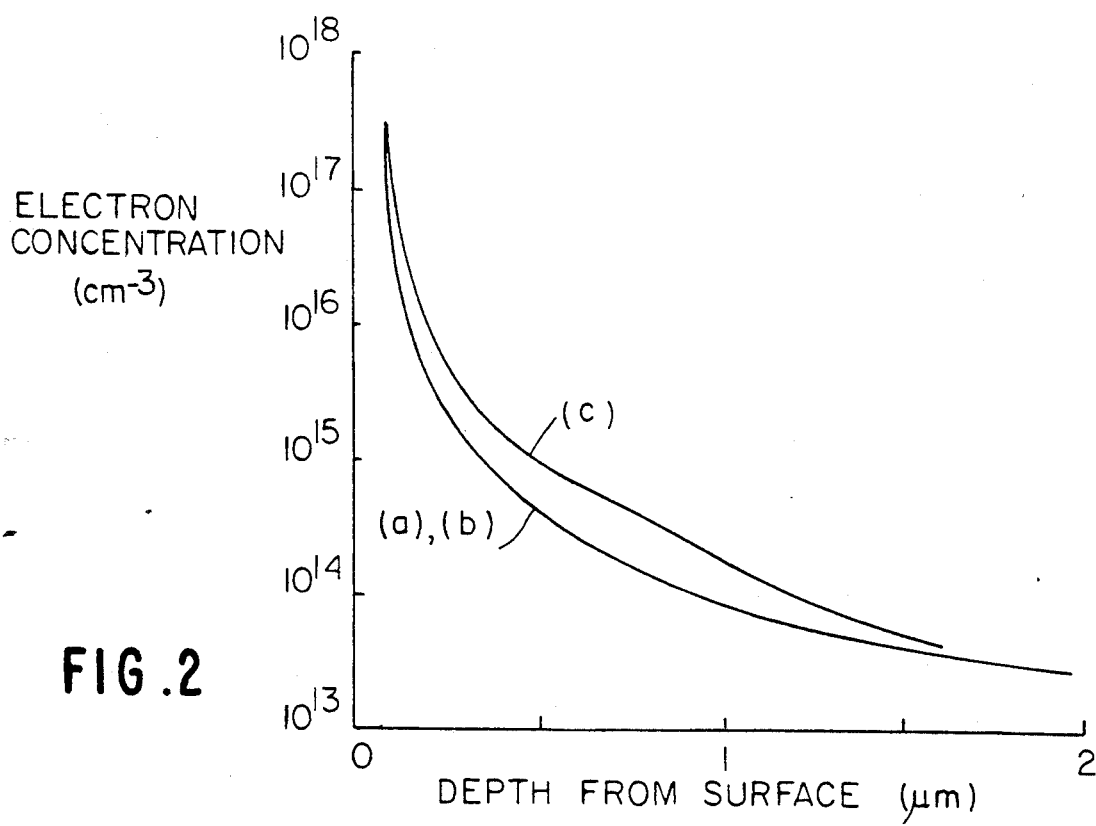
FIG. 2 shows the relationship between the depth from the surface and the electron concentration for each of the epitaxial crystals obtained in some of Examples and Comparative Examples given later.

A part of the remaining crystal samples was etched at a depth of 3,000 Å and an Al electrode having a diameter of 200 μm was formed on the etched surface by vapor deposition. Each sample was examined for electron concentration profile by a c-v method and, as a result, a good profile as shown in FIG. 2 (a) was obtained.

Subsequently, a recessed gate type FET, as shown in the plan view of FIG. 3, was fabricated using one of the remaining crystal samples by forming source electrode 13 and drain electrode 14 and further forming a gate electrode 15 having a gate length of 1 μm and gate width of 250 μm (side gate 16 shown in FIG. 3 was omitted). As shown in FIG. 4 which is a schematic sectional view taken on line A—A' of FIG. 3, the above-fabricated FET had a structure comprising GaAs substrate 21 and, formed thereon, GaAs layer 20, oxygen-doped AlGaAs layer 19, high-purity AlGaAs layer 18, and Si-doped n-type GaAs layer 17.

Figure 5:
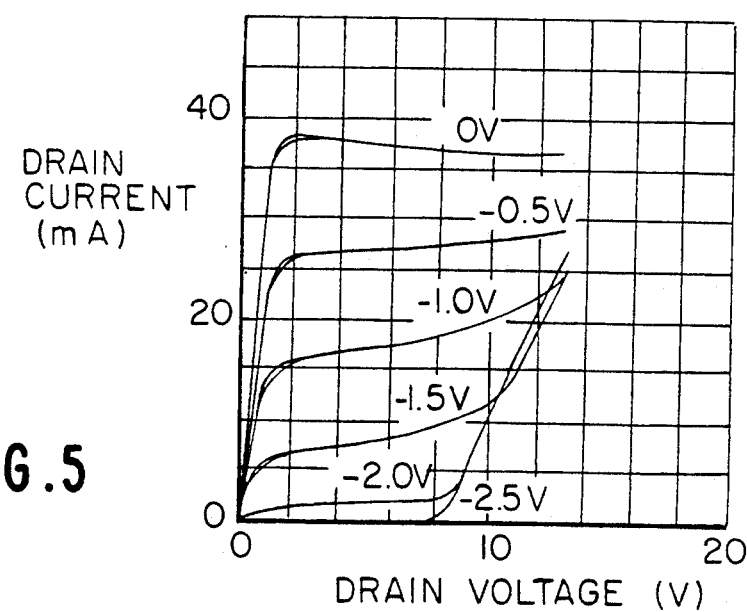
FIG. 5 and FIGS. 7 to 10 show the statistic characteristics of the recessed gate type FETs obtained in Examples and Comparative Examples.

The static characteristics of the FET obtained were examined. As a result, good static characteristics data with little hysteresis and no kink phenomenon were obtained as shown in FIG. 5. In FIG. 5, the drain voltage is plotted as abscissa and the drain current as ordinate, with the gate voltage being a parameter; the same applies to the other figures showing static characteristics.

Figure 3:
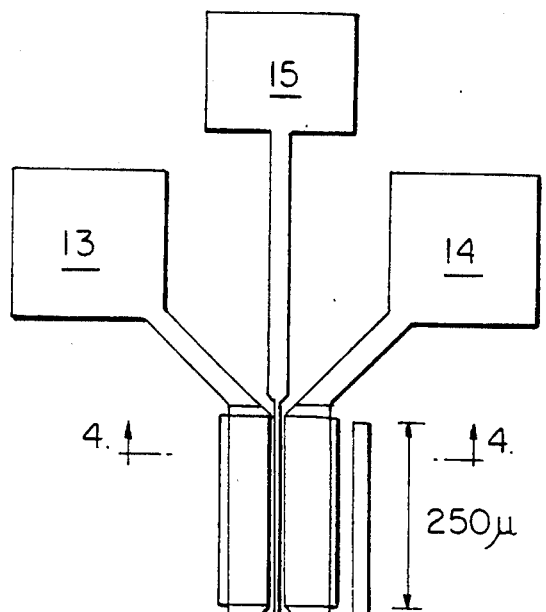
FIG. 3 is a plan view of the pattern of a recessed gate type FET element for evaluation.
Figure 4:
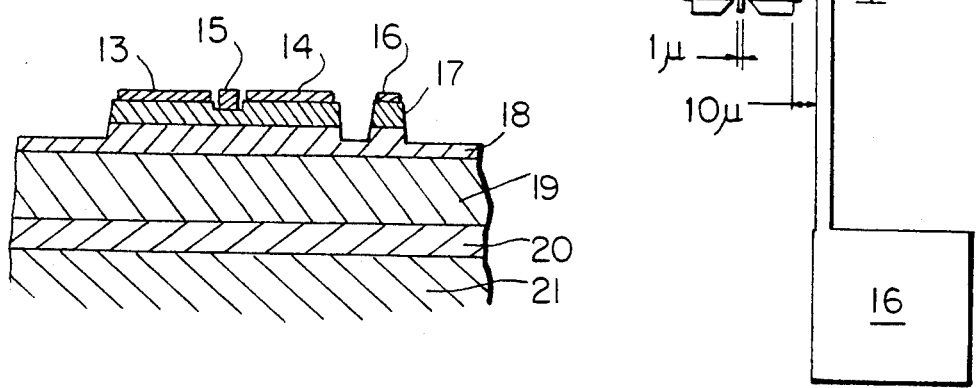
FIG. 4 is a schematic sectional view of the pattern of the recessed gate type FET element of FIG. 3.

The same FET fabrication procedure as the above was then conducted except that gate electrode 15 and side gate electrode 16 shown in FIG. 3 were not formed and that a groove having a depth of 0.6 μm and a width of 5 μm was formed throughout the distance (about 10 μm) between source electrode 13 and drain electrode 14. The leakage current between the drain and source electrodes was measured. As a result, the leakage current at an applied voltage of 10 V was $5.1 \times 10^{-9}$ A, and even at an applied voltage of 100 V, the leakage current was as low as less than 1 μA. This shows that an excellent buffer layer having an extremely high resistivity had been formed.

Figure 6:
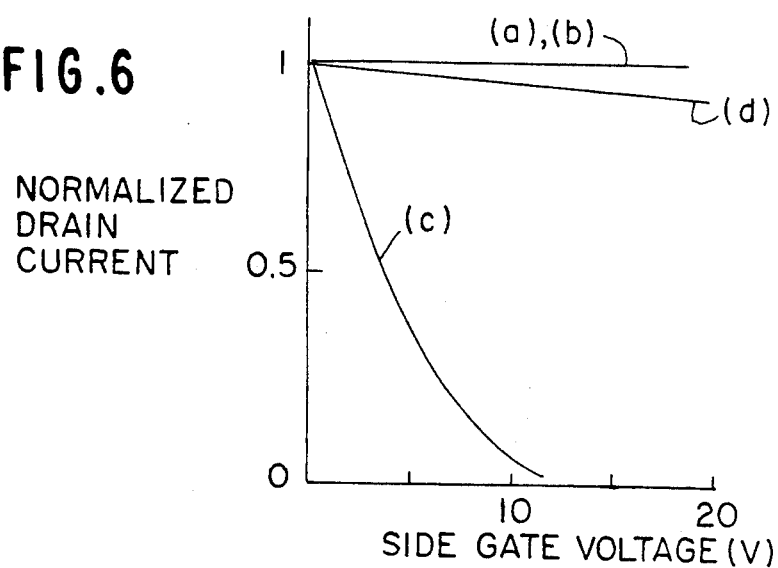
FIG. 6 shows the side gate voltage dependence of the drain current for the recessed gate type FETs having a side gate electrode obtained in Examples and Comparative Examples.

Thereafter, a sample of an FET which was the same as that prepared above and a side gate electrode 16 formed beside the FET was fabricated as shown in FIG. 3. A voltage was applied to side gate electrode 16, and the influence of this voltage application on the drain-source current in the FET was examined. As a result, substantially no influence of the side gate voltage was observed on the drain-source current, as shown in FIG. 6 (a). This measurement was made at an FET drain voltage $V_{ds}$ of 2 V and a gate voltage $V_{gs}$ of 0 V. In FIG. 6, the side gate voltage, $V_{sg}$ (V), is plotted as abscissa, and normalized drain current values, which are values obtained by normalizing drain current values $I_{ds}$ with the drain current value at a side gate voltage $V_{sg}$ of 0 V, are plotted as ordinate. The above results show that the buffer layer in this sample had excellent characteristics with respect to the isolation of elements adjacent to each other.

EXAMPLE 2

Crystal growth was conducted in the same manner as in Example 1 except that in the growth of the $Al_xGa_{(1-x)}As$ layer in which x is 0.5, TMA gas having an impurity oxygen concentration of about 4,000 ppm was fed at a feed rate of $5.2 \times 10^{-5}$ mol/min and the feeding of commercially available TMA was omitted.

A part of the samples thus obtained was subjected to Hall effect measurement. As a result, the samples were found to have an electron mobility of 3,900 $cm^2/V \cdot sec$ and a sheet carrier concentration of $5 \times 10^{12}/cm^2$ at room temperature. The samples after the Hall effect measurement were then subjected to etching in which the whole surface of each sample exclusive of electrode parts thereof was etched at a depth of about 0.6 $\mu m$, thereby removing the n-type doped GaAs layer in the part other than the electrode parts. The resistivity of the thus-exposed undoped AlGaAs layer was measured and found to be $1 \times 10^5$ $\Omega \cdot cm$ or more showing that the AlGaAs layer had a high resistivity.

A part of the remaining crystal samples was then examined for electron concentration profile by a c-v method in the same manner as in Example 1 and, as a result, a good profile as shown in FIG. 2 (b) was obtained.

Figure 7:
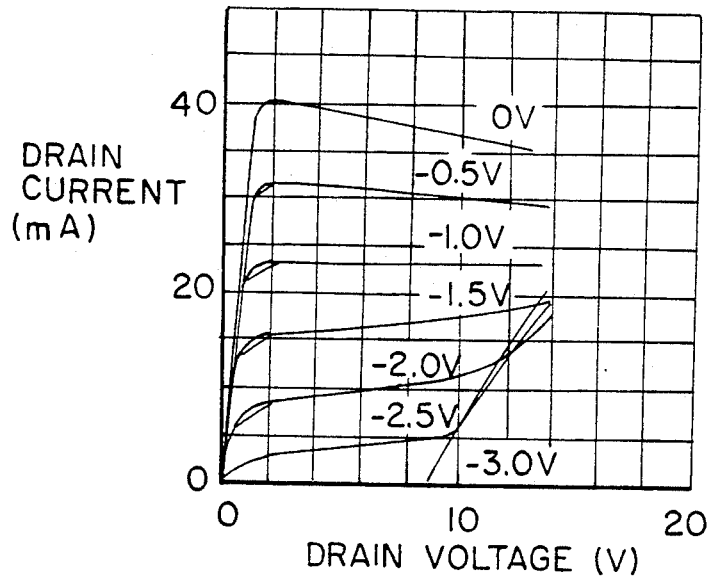

Subsequently, a recessed gate type FET was fabricated using one of the remaining crystal samples in the same manner as in Example 1 and the static characteristics of this FET were examined. As a result, good static characteristics data with little hysteresis and no kink phenomenon were obtained as shown in FIG. 7.

Leakage current measurement was then made in the same manner as in Example 1. As a result, the leakage current at an applied voltage of 10 V was $0.5 \times 10^{-9}$ A, and even at an applied voltage of 100 V, the leakage current was as low as less than 1 $\mu$A. This shows that a buffer layer having an extremely high resistivity had been formed.

Thereafter, side gate characteristics were examined in the same manner as in Example 1. As a result, like the sample of Example 1, this sample showed good side gate characteristics as shown in FIG. 6 (b). The results show that the buffer layer in this sample had excellent characteristics with respect to the isolation of elements adjacent to each other.

COMPARATIVE EXAMPLE 1

Crystal growth was conducted in the Same manner as in Example 1 except that in the growth of the $Al_xGa_{(1-x)}As$ layer in which x is 0.5, commercially available TMA was fed at a feed rate of $5.2 \times 10^{-5}$ mol/min and the feeding of oxygen-containing TMA gas was omitted.

A part of the samples thus obtained was subjected to Hall effect measurement. As a result, the samples were found to have an electron mobility of 3,900 $cm^2/V \cdot sec$ and a sheet carrier concentration of $4.5 \times 10^{12/cm2}$ at room temperature.

The samples after the Hall effect measurement were then subjected to etching in which the whole surface of each sample exclusive of electrode parts thereof was etched at a depth of about 0.6 $\mu m$, thereby removing the n-type doped GaAs layer in the part other than the electrode parts. The resistivity of the thus-exposed undoped AlGaAs layer was measured and found to be as low as 2 to 5 $\Omega \cdot cm$. Thus, the AlGaAs layer showed p-type conduction.

Figure 8:
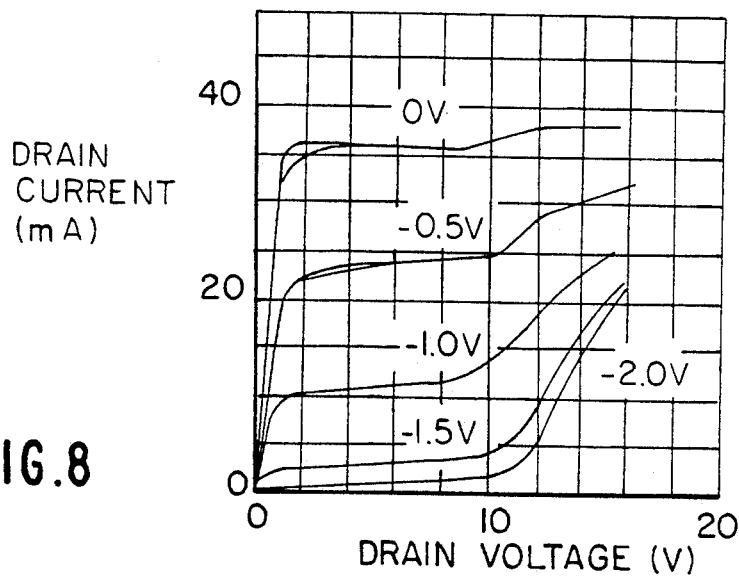

Subsequently, a recessed gate type FET was fabricated using one of the remaining crystal samples in the same manner as in Example 1 and the static characteristics of this FET were examined. As shown in FIG. 8, this FET showed a so-called kink phenomenon in which the drain current increased abnormally at drain voltages around 10 V.

Leakage current measurement was then made in the same manner as in Example 1. As a result, the leakage current at an applied voltage of 10 V was $1.4 \times 10^{-6}$ A. Further, the leakage current was higher than 1 $\mu$A at an applied voltage of 9.6 V, showing that the resistivity of the buffer layer was too low for FET.

Thereafter, side gate characteristics were examined in the same manner as in Example 1. As a result, the drain current changed considerably with changing side gate voltage as shown in FIG. 6 (c), indicating that the buffer layer in this sample had poor characteristics with respect to the isolation of elements adjacent to each other.

It was found from the above results that in the case of employing an oxygen-undoped layer as the substrate-side buffer layer, the buffer resistivity and FET characteristics are poor and the element-isolating characteristics are also poor.

COMPARATIVE EXAMPLE 2

Crystal growth was conducted in the same manner as in Comparative Example 1 except that in the growth of the $Al_xGa_{(1-x)}As$ buffer layer, x indicating the proportion of Al was 0.2 and commercially available TMA was fed at a feed rate of $1.3 \times 10^{-5}$ tool/min.

A part of the samples thus obtained was subjected to Hall effect measurement. As a result, the samples were found to have an electron mobility of 3,900 $cm^2/V \cdot sec$ and a sheet carrier concentration of $5 \times 10^{12}/cm^2$ at room temperature.

The samples after the Hall effect measurement were then subjected to etching in which the whole surface of each sample exclusive of electrode parts thereof was etched at a depth of about 0.6 $\mu m$, thereby removing the n-type doped GaAs layer in the part other than the electrode parts. The resistivity of the thus-exposed undoped AlGaAs layer was measured and found to be $1 \times 10^3$ $\Omega \cdot cm$. Thus, the AlGaAs layer showed n-type conduction.

Each of part of the remaining crystal samples was then examined for electron concentration profile by a c-v method and, as a result, a profile was obtained in which there was a slight tendency for the buffer layer to accumulate carriers therein, as shown in FIG. 2 (c).

Figure 9:
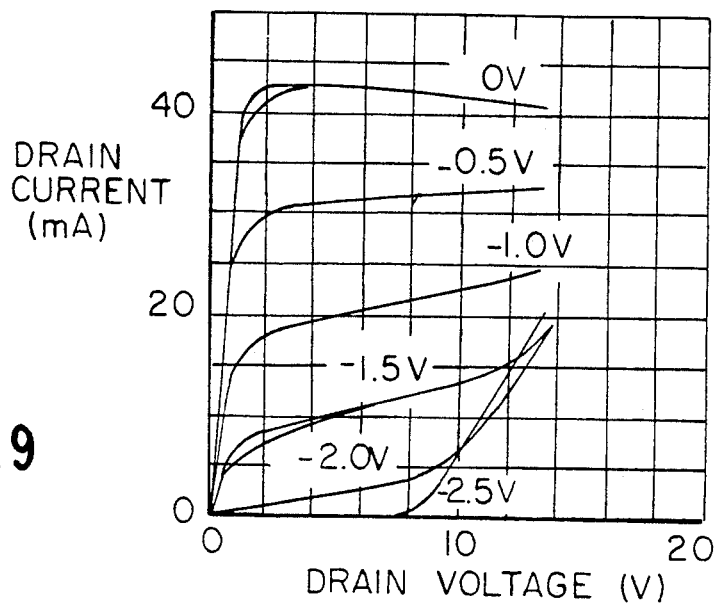

Subsequently, a recessed gate type FET was fabricated using one of the remaining crystal samples in the same manner as in Example 1 and the static characteristics of this FET were examined. As a result, good static characteristics data with little hysteresis and few kinks were obtained as shown in FIG. 9.

Leakage current measurement was then made in the same manner as in Example 1. As a result, the leakage current at an applied voltage of 10 V was $1.2 \times 10^{-8}$ A.

Further, the leakage current was higher than 1 μA at an applied voltage of 67 V, showing that the resistivity of the buffer layer was a little too low for FET.

Thereafter, side gate characteristics were examined in the same manner as in Example 1. As a result, the drain current changed with changing side gate voltage as shown in FIG. 6 (d), indicating that the buffer layer in this sample had poor characteristics with respect to the isolation of elements adjacent to each other.

It was found from the above results that this sample was good in FET static characteristics but poor in buffer resistivity and element-isolating characteristics.

COMPARATIVE EXAMPLE 3

Crystal growth was conducted in the same manner as in Comparative Example 2 except that in the growth of the $Al_xGa_{(1-x)}As$ buffer layer, x indicating the proportion of Al was 0.2, commercially available TMA was fed at a feed rate of $1.3 \times 10^{-5}$ mol/min, and oxygen diluted with nitrogen to 100 ppm was incorporated in an amount of 2 sccm (standard cubic centimeter per minute).

A part of the samples thus obtained was subjected to Hall effect measurement. As a result, the samples were found to have an electron mobility of 3,900 cm$^2$/V·sec and a sheet carrier concentration of $4.5 \times 10^{12}$/cm$^2$ at room temperature.

The samples after the Hall effect measurement were then subjected to etching in which the whole surface of each sample exclusive of electrode parts thereof was etched at a depth of about 0.6 μm, thereby removing the n-type doped GaAs layer in the part other than the electrode parts. The resistivity of the thus-exposed un-doped AlGaAs layer was measured and found to be $1 \times 10^5$ Ω·cm or more.

Figure 10:
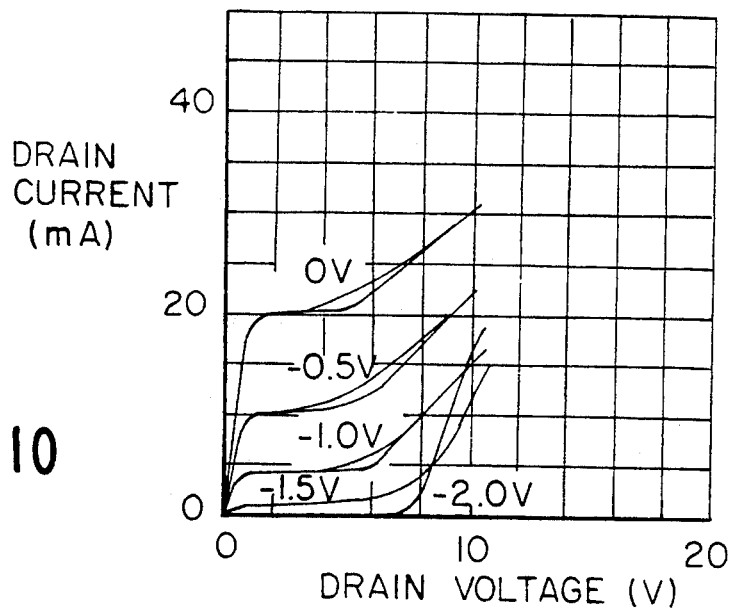

Subsequently, a recessed gate type FET was fabricated using one of the remaining crystal samples in the same manner as in Example 1 and the static characteristics of this FET were examined. As a result, abnormal static characteristics data were obtained in which a strong kink phenomenon occurred at drain voltages around 5 V, as shown in FIG. 10.

Leakage current measurement was then made in the same manner as in Example 1. As a result, the leakage current at an applied voltage of 10 V was $1.2 \times 10^{-8}$ A, and even at an applied voltage of 100 V, the leakage current was as low as 1 μA or less. This shows that the buffer layer had good resistivity sufficient for FET.

It was found from the above results that this sample was good in buffer resistivity but poor in FET characteristics because of the occurrence of an intensive kink.

While the invention has been described in detail and with reference to specific embodiments thereof, it will be apparent to one skilled in the art that various changes and modifications can be made therein without departing from the spirit and scope thereof.

What is claimed is:

1. An epitaxially grown compound-semiconductor crystal comprising a substrate, a buffer layer formed directly or indirectly on said substrate, and an active layer formed on said buffer layer, said buffer layer comprising (A) a high-resistivity AlGaAs or AlGaInP layer doped with oxygen or/and a transition metal and, formed thereon, (B) a layer consisting of high-purity GaAs, InGaP, or AlGaAs.

2. An epitaxially grown compound-semiconductor crystal as claimed in claim 1, which further comprises an undoped GaAs or InP layer formed between said substrate and said high-resistivity AlGaAs or AlGaInP layer (A) doped with oxygen or/and a transition metal.

3. An epitaxially grown compound-semiconductor crystal as claimed in claim 1, wherein said layer (A) is a high-resistivity AlGaAs or AlGaInP layer doped with oxygen.

4. An epitaxially grown compound-semiconductor crystal as claimed in any one of claims 1 to 3, wherein said layer (A) is a high-resistivity AlGaAs layer having a composition of formula $Al_xGa_{(1-x)}As$, where $0.1 < x < 0.8$.

5. An epitaxially grown compound-semiconductor crystal as claimed in claim 4, wherein said high-resistivity AlGaAs layer (A) has a composition of formula $Al_xGa_{(1-x)}As$, where $0.2 \leq x \leq 0.7$.

6. An epitaxially grown compound-semiconductor crystal as claimed in any one of claims 1 to 3, wherein said layer (A) is a high-resistivity AlGaInP layer having a composition of the formula $Al_xIn_yGa_{(1-x-y)}P$, where $0 < x \leq$ (about 0.51) and y is about 0.49.

7. An epitaxially grown compound-semiconductor crystal as claimed in claim 1, wherein said high-resistivity AlGaAs or AlGaInP layer (A) doped with oxygen or/and a transition metal has a total concentration of oxygen and transition metal of from $1 \times 10^{16}$ atoms/cm$^3$ to about $1 \times 10^{21}$ atoms/cm$^3$.

8. An epitaxially grown compound-semiconductor crystal as claimed in claim 7, wherein said layer (A) has a total concentration of oxygen and transition metal of from $1 \times 10^{17}$ atoms/cm$^3$ to about $1 \times 10^{20}$ atoms/cm$^3$.

9. An epitaxially grown compound-semiconductor crystal as claimed in any one of claims 1 to 3, wherein said high-resistivity AlGaAs or AlGaInP layer (A) doped with oxygen or/and a transition metal has a thickness of from 2,000 Å to 5 μm.

10. An epitaxially grown compound-semiconductor crystal as claimed in claim 9, wherein said layer (A) has a thickness of from 5,000 Å to 5 μm.

11. An epitaxially grown compound-semiconductor crystal as claimed in any one of claims 1 to 3, wherein said layer (B) consisting of high-purity GaAs, InGaP, or AlGaAs has an active defect concentration of less than $1 \times 10^{16}$ per cm$^3$.

12. An epitaxially grown compound-semiconductor crystal as claimed in claim 11, wherein said layer (B) has an active defect concentration of $1 \times 10^{15}$ per cm$^3$ or less.

13. An epitaxially grown compound-semiconductor crystal as claimed in any one of claims 1 to 3, wherein said layer (B) consisting of high-purity GaAs, InGaP, or AlGaAs has a thickness of from 1,000 Å to 20,000 Å.

14. An epitaxially grown compound-semiconductor crystal as claimed in claim 13, wherein said layer (B) has a thickness of from 3,000 Å to 20,000 Å.

15. An epitaxially grown compound-semiconductor crystal as claimed in claim 14, wherein said layer (B) has a thickness of from 5,000 Å to 10,000 Å.

16. An epitaxially grown compound-semiconductor crystal as claimed in any one of claims 1 to 3, wherein said active layer is an n-type GaAs or n-type InGaP layer, said epitaxially grown compound-semiconductor crystal being for use in the fabrication of a field-effect transistor.

17. An epitaxially grown compound-semiconductor crystal for a field-effect transistor, which comprises a GaAs substrate having consecutively thereon an undoped GaAs layer; a high-resistivity AlGaAs or AlGaInP layer (A) doped with oxygen or/and a transition metal; a high-purity GaAs, InGaP, or AlGaAs layer (B); and an n-type GaAs or n-type InGaP active layer.

* * * * *